United States Patent
Kanda

(10) Patent No.: US 8,502,455 B2
(45) Date of Patent: Aug. 6, 2013

(54) ATMOSPHERIC INDUCTIVELY COUPLED PLASMA GENERATOR

(75) Inventor: Tetsuya Kanda, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 316 days.

(21) Appl. No.: 12/786,387

(22) Filed: May 24, 2010

(65) Prior Publication Data

US 2010/0300620 A1 Dec. 2, 2010

Related U.S. Application Data

(60) Provisional application No. 61/182,229, filed on May 29, 2009.

(51) Int. Cl.
*H05B 31/26* (2006.01)

(52) U.S. Cl.
USPC .............................. 315/111.21; 315/111.51

(58) Field of Classification Search
USPC ....... 315/111.21, 111.41, 111.51; 156/345.28
See application file for complete search history.

(56) References Cited

U.S. PATENT DOCUMENTS

| | | | |
|---|---|---|---|
| 5,394,061 A * | 2/1995 | Fujii | 315/111.21 |
| 5,478,429 A | 12/1995 | Komino et al. | |
| 5,571,366 A * | 11/1996 | Ishii et al. | 156/345.26 |
| 5,688,357 A | 11/1997 | Hanawa | |
| 5,936,481 A | 8/1999 | Fujii | |
| 6,867,859 B1 * | 3/2005 | Powell | 356/316 |
| 6,887,339 B1 * | 5/2005 | Goodman et al. | 156/345.28 |
| 7,306,745 B1 | 12/2007 | Bhardwaj et al. | |
| 7,489,206 B2 | 2/2009 | Kotani et al. | |
| 2002/0026251 A1 * | 2/2002 | Johnson et al. | 700/67 |

FOREIGN PATENT DOCUMENTS

| | | |
|---|---|---|
| EP | 0 568 920 B1 | 3/1996 |
| JP | 5-89824 A1 | 4/1993 |
| JP | 63-135799 A1 | 9/1998 |
| JP | 2000-49000 A1 | 2/2000 |
| JP | 2000-49000 A5 | 9/2005 |
| JP | 2000-49000 A5 | 8/2007 |

* cited by examiner

*Primary Examiner* — Tung X Le

(57) ABSTRACT

In an atmospheric inductively coupled plasma generating apparatus, impedance matching between a coil for plasma generation and an RF power source is effected at a high speed. A control method and/or condition for the output frequency of an oscillator which supplies a power to the coil for plasma generation or a control method and a control condition for the output power of the oscillator are changed appropriately in accordance with a generation state of a plasma. When a plasma is not generated, the output frequency is controlled according to a first condition and, when a plasma is generated, the output frequency is controlled according to a second condition different from the first condition. When a plasma is not generated, the output power is controlled according to a third condition and, when a plasma is generated, the output power is controlled according to a fourth condition different from the third condition.

19 Claims, 3 Drawing Sheets

ATMOSPHERIC INDUCTIVELY COUPLED PLASMA GENERATOR

BACKGROUND OF THE INVENTION

The present invention relates to an apparatus for generating an inductively coupled plasma under atmospheric pressure.

A conventional atmospheric inductively coupled plasma generating apparatus includes an impedance matching network circuit between a coil for generating an inductively coupled plasma under atmospheric pressure and an oscillator for generating a radio-frequency power (see, e.g., Patent Documents 1 and 2). The atmospheric inductively coupled plasma generating apparatus is hereinafter referred to as a plasma generating apparatus. The impedance matching network circuit includes a series capacitor and a shunt capacitor. At least one of the series capacitor and the shunt capacitor is mechanically controlled with a servo motor or the like, and undergoes a change in its capacitance. The series capacitor and the shunt capacitor are controlled so as to supply the RF power to the coil for plasma generation with maximal efficiency. Another conventional plasma generating apparatus includes a self-excited oscillation circuit including a coil for plasma generation as a part of a circuit, instead of including a mechanically controlled capacitor (see, e.g., Patent Document 3). The oscillation frequency of the oscillation circuit is controlled so as to supply a predetermined RF power to the coil for plasma generation. As another example, there is a plasma processing apparatus which generates an inductively coupled plasma under a pressure close to that in a vacuum (see, e.g., Patent Documents 4 to 10). Under a pressure close to that in a vacuum, plasma discharge is more easily initiated, and more easily maintained than under atmospheric pressure (according to the Paschen's law). In addition, because there are fewer gas molecules which could serve as a conductor under a pressure close to that in a vacuum, the apparent inductance of a coil for exciting an inductively coupled plasma is more stable than under atmospheric pressure.

Prior art documents we found are as follows: Japanese Utility Model Application Laid-open No. Showa 63-135799 (FIG. 1); JP Patent Laid Open No. Heisei 05-89824 A (FIG. 1); EP 0568920A1; U.S. Pat. Nos. 5,936,481A; 5,478,429A; JP Patent Laid-open No. 2000-49000 A; JP Patent Laid-open No. Heisei 09-161994A; U.S. Pat. Nos. 7,489,206B2; 5,688,357A; 7,306,745B1.

On the other hand, under atmospheric pressure, the impedance of the coil for plasma generation undergoes a significant change before and after plasma generation. In addition, the impedance of the coil for plasma generation may significantly fluctuate under the influence of an analysis target sample which is introduced after plasma generation. In the case of mechanically controlling the capacitance of the capacitor in the plasma generating apparatus, the speed at which the capacitance varies, that is, a matching speed presents a problem. For example, when the impedance of the coil for plasma generation has undergone a significant change, the plasma may become unstable or vanish before a proper matching state is restored. When the plasma has abruptly vanished, an extreme impedance mismatch may occur to excessively increase a load on an RF power source device, which may lead to a fault in the RF power source device.

In the case where the plasma generating apparatus has the self-excited oscillation circuit described above, there arises a problem that an amplifier element to be used cannot be freely selected. That is, because the amplifier element also serves as an oscillator element, a technology such as a power combining technology cannot be used, and hence it is necessary to select a high-cost element excellent in withstand voltage characteristics and loss resistance characteristics.

Further, because a plasma under a pressure close to that in a vacuum is different in characteristics from a plasma under atmospheric pressure, it is difficult to directly divert the technology used in the plasma processing apparatus to an atmospheric plasma generating apparatus.

It is therefore an object of the present invention to provide an atmospheric inductively coupled plasma generating apparatus including, as an RF power source for a coil for plasma generation, a separately excited oscillator, i.e., an oscillator which does not have the coil for plasma generation as a component of an oscillation circuit, in which impedance matching between the coil for plasma generation and the RF power source device is effected at a speed higher than in the case of using a matching network circuit based on mechanical control of the capacitance of a capacitor. To attain the above-mentioned object, according to the present invention, a control condition for the output frequency of the oscillator which supplies the power to the coil for plasma generation is appropriately changed in accordance with the generation state of the plasma. Alternatively, according to the present invention, control conditions for the output frequency of the oscillator and the output power thereof are appropriately changed in accordance with the generation state of the plasma. Further, according to the present invention, control methods therefor are appropriately changed in accordance with the generation state of the plasma.

Specifically, according to a first invention of the present invention, there is provided an atmospheric inductively coupled plasma generating apparatus comprising: an oscillator which is controllable in output frequency; a coil which is supplied with a power from the oscillator and generates an inductively coupled plasma with the power under atmospheric pressure; an impedance matching device disposed between the oscillator and the coil; a measuring device for measuring one of: respective phases of a voltage and a current in a line between the oscillator and the impedance matching device; a phase difference between the voltage and the current in the line; a parameter of a reflected wave in the line; and a ratio between the same parameters of a traveling wave and the reflected wave in the line; and a control device for controlling the output frequency of the oscillator based on a result of the measurement by the measuring device, the control device controlling the output frequency in accordance with a generation state of the atmospheric inductively coupled plasma.

Also, according to a second invention of the present invention, in the atmospheric inductively coupled plasma generating apparatus according to the first invention: when the inductively coupled plasma is not generated, the control device controls the output frequency according to a first condition; and when the inductively coupled plasma is generated, the control device controls the output frequency according to a second condition different from the first condition.

Further, according to a third invention of the present invention, in the atmospheric inductively coupled plasma generating apparatus according to the second invention: when the inductively coupled plasma is not generated, the control device controls the output frequency such that the phase of the voltage is caused to lead the phase of the current; and when the inductively coupled plasma is generated, the control device controls the output frequency such that the phase difference between the voltage and the current is reduced to zero.

Still further, according to a fourth invention of the present invention, in the atmospheric inductively coupled plasma generating apparatus according to the second invention: when the inductively coupled plasma is not generated, the control device controls the output frequency according to the first condition by a first control method; and when the inductively coupled plasma is generated, the control device controls the output frequency according to the second condition by a second control method different from the first control method.

Also, according to a fifth invention of the present invention, in the atmospheric inductively coupled plasma generating apparatus according to the fourth invention: each of the first control method and the second control method comprises PID control; and the second control method has a PID constant different from that of the first control method.

Further, according to a sixth invention of the present invention, in the atmospheric inductively coupled plasma generating apparatus according to the first invention: the oscillator is controllable in output power; and the control device controls the output power of the oscillator in accordance with a generation state of the inductively coupled plasma.

Further, according to a seventh invention of the present invention, in the atmospheric inductively coupled plasma generating apparatus according to the sixth invention: when the inductively coupled plasma is not generated, the control device controls the output power of the oscillator according to a third condition; and when the inductively coupled plasma is generated, the control device controls the output power according to a fourth condition different from the third condition.

Still further, according to an eighth invention of the present invention, in the atmospheric inductively coupled plasma generating apparatus according to the sixth invention: when the inductively coupled plasma is not generated, the control device controls the output power according to the third condition by a third control method; and when the inductively coupled plasma is generated, the control device controls the output power according to the fourth condition by a fourth control method different from the third control method.

Also, according to a ninth invention of the present invention, in the atmospheric inductively coupled plasma generating apparatus according to the eighth invention: each of the third control method and the fourth control method comprises PID control; and the fourth control method has a PID constant different from that of the third control method.

Further, according to a tenth invention of the present invention, in the atmospheric inductively coupled plasma generating apparatus according to the first invention, the oscillator is of a separately excited type.

According to the present invention, the impedance matching between the oscillator and the coil for plasma generation is effected by controlling the output frequency of the oscillator. Therefore, even when the apparent impedance of the coil for plasma generation has undergone a rapid change due to a sample introduced into a torch, it is possible to promptly cope with the change. As a result, unintended extinction of the plasma during the analysis of a sample such as an organic solvent is suppressed. In addition, the present invention individually provides control methods and control conditions for the output frequency and output power of the oscillator for each of the time of no plasma generation (i.e., the time when no plasma is generated) and the time of plasma generation (i.e., the time when a plasma is generated), and the methods and the conditions are selectively used, which renders the ignition of a plasma as well as the maintenance of the state where the plasma is generated easier than before.

DETAILED DESCRIPTION

Figure 1:
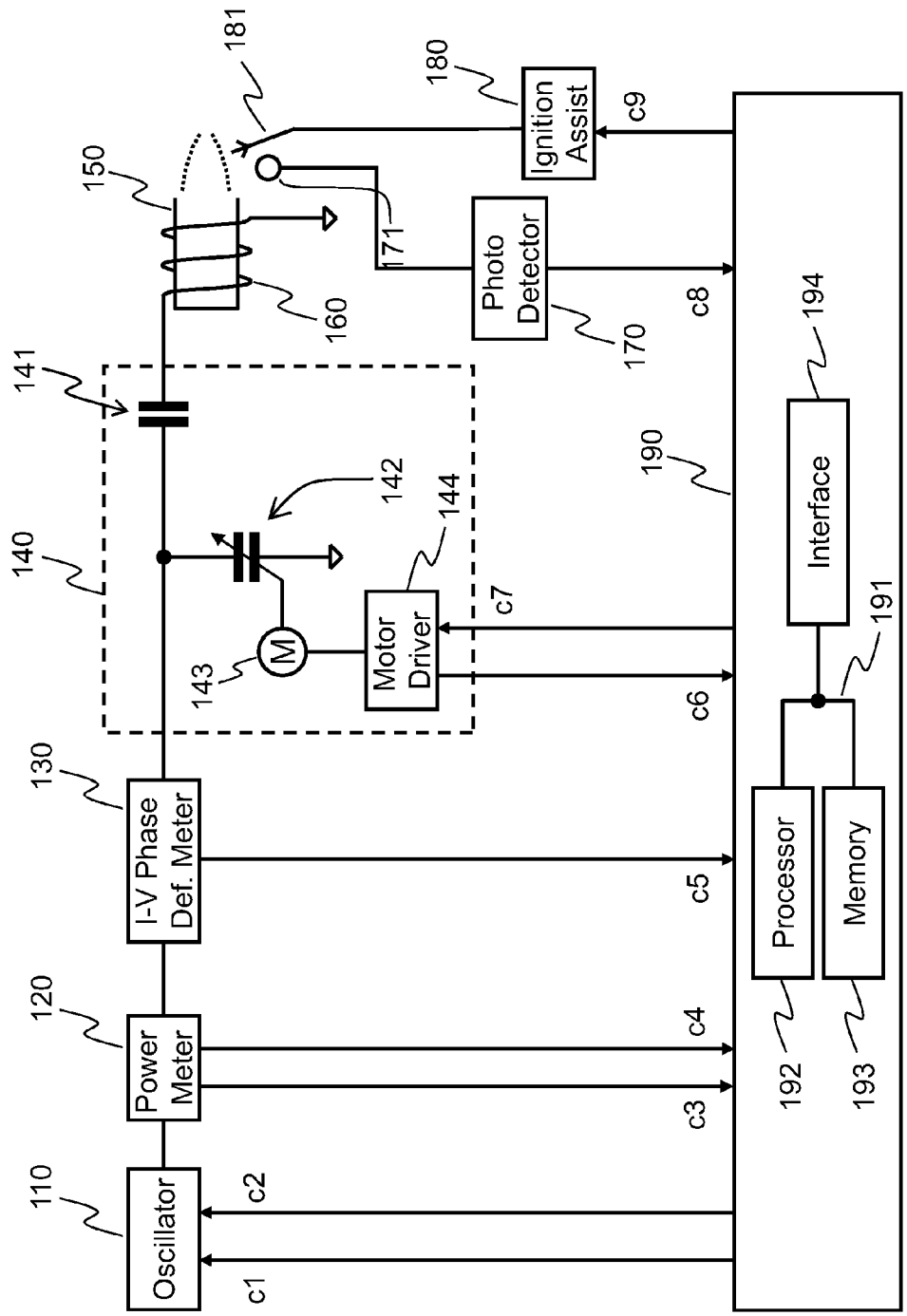
[FIG. 1] A view illustrating a schematic configuration of a plasma generating apparatus 100 as a preferred embodiment of the present invention.

Hereinbelow, the present invention is described based on the preferred embodiments thereof illustrated in the accompanying drawings. Here, FIG. 1 is referred to. FIG. 1 is a view illustrating a schematic configuration of an atmospheric inductively coupled plasma generating apparatus 100 as a first embodiment of the present invention. The atmospheric inductively coupled plasma generating apparatus 100 is provided in an atmospheric inductively coupled plasma mass spectrometric analyzer (ICP/MS), an atmospheric inductively coupled plasma emission spectroscopic analyzer (ICP/AES), or the like. The atmospheric inductively coupled plasma generating apparatus 100 is hereinafter referred to as the plasma generating apparatus 100.

First, the configuration of the plasma generating apparatus 100 is described. The plasma generating apparatus 100 includes an oscillator 110, a through power meter 120, a current-voltage phase difference meter 130, an impedance matching network circuit 140, a coil for plasma generation 160 disposed around a plasma torch 150, a plasma photodetector 170, a plasma ignition assist device 180, and a control device 190. The impedance matching network circuit 140 is hereinafter referred to as the matching circuit 140. The coil for plasma generation 160 is hereinafter referred to as the coil 160. The oscillator 110 is an alternating-current signal generating device which generates an RF power. The output frequency of the oscillator 110 is variable between several megahertz and several tens of megahertz, and the output power thereof is variable between several tens of watts and several kilowatts. The output frequency of the oscillator 110 is controlled by a signal c1, and the output power of the oscillator 110 is controlled by a signal c2. The through power meter 120 is a device disposed between the oscillator 110 and the coil 160 to measure a power (traveling wave power) which passes therethrough from the oscillator 110 in the direction of the coil 160, and a power (reflected wave power) which passes therethrough from the coil 160 in the direction of the oscillator 110. The through power meter 120 outputs a signal c3 representing a measured value of the traveling wave power, and a signal c4 representing a measured value of the reflected wave power. The current-voltage phase difference meter 130 is a device disposed between the through power meter 120 and the coil 160 to measure the phase difference between voltage and current at a portion located on a line between the through power meter 120 and the coil 160, and subjected to probing by the current-voltage phase difference meter 130. The current-voltage phase difference meter 130 outputs a signal c5 representing a measured value of the phase difference. The matching circuit 140 is an impedance matching device including a fixed-capacitance capacitor 141 disposed between the current-voltage phase difference meter 130 and the coil 160, and a variable-capacitance capacitor 142 having one terminal thereof connected between the current-voltage phase difference meter 130 and the capacitor 141, and forming a shunt path. The capacitor 142 is mechanically controlled by a servo motor 143, and undergoes a change in its capacitance. A motor driver 144 electrically drives the servo motor 143 in accordance with a position control signal c7, and outputs information c6 on the rotational position of the servo motor 143. The plasma torch 150 is connected to a nebulizer or the like, though not illustrated, and supplied with an atomized sample, an auxiliary gas, a carrier gas, and the like. The plasma photodetector 170 is a device which detects light emitted from a plasma generated in the plasma torch 150, and measures the intensity thereof. The intensity of the light emitted from the plasma is measured with a sensor 171 connected to the plasma photodetector 170. The plasma photodetector 170 outputs a signal $c8$ representing a measured value of the intensity of plasma emission. The plasma ignition assist device 180 typically includes a Tesla coil, and supplies a high-frequency and high-voltage ac power to an antenna 181. The antenna 181 is disposed in the vicinity of the plasma torch 150, and discharges electricity to assist the ignition of the plasma in the plasma torch 150 when the power mentioned above is supplied thereto from the plasma ignition assist device 180. The plasma ignition assist device 180 starts or stops power supply to the antenna 181 in response to a control signal $c9$. The control device 190 includes a processor 192, a memory 193, and an interface 194 which are connected by a bus 191. The processor 192 is a device which executes a data arithmetic operation, and a program. The processor 192 is typically a CPU or an MPU, but may also be an ASIC having a CPU core or the like. The memory 193 is a device for storing therein data and a program. The memory 193 is typically a RAM or ROM, but examples thereof may also include another recording medium or storage medium such as a hard disk drive or a CD-ROM drive. The interface 194 is a device which wirelessly or wiredly effects communication between the inside and outside of the control device 190. For example, the transmission/reception of the signals $c1$ to $c9$ is performed via the interface 194. Examples of the interface 194 may also include a keyboard and a display. The control device 190 may be provided in, e.g., the atmospheric inductively coupled plasma generating apparatus 100, or may also be an external device connected to the atmospheric inductively coupled plasma generating apparatus 100. The control device 190 receives the signals $c3$, $c4$, $c5$, $c6$, and $c8$. The control device 190 also supplies the signals $c1$ and $c2$ to the oscillator 110. In addition, the control device 190 also supplies the signal $c7$ to the motor driver 170. Further, the control device 190 supplies the signal $c9$ to the plasma ignition assist device 180.

Figure 2:
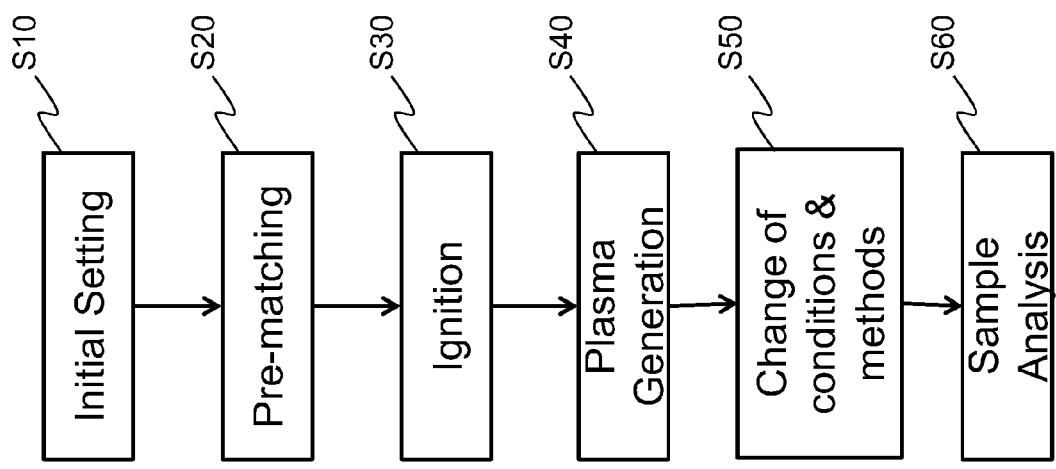
[FIG. 2] A flow chart illustrating an operation of the plasma generating apparatus 100.

Next, a description is given of the operation of the plasma generating apparatus 100. In addition to FIG. 1, FIG. 2 is also referred to here. FIG. 2 is a flow chart illustrating the operation of the plasma generating apparatus 100. It is assumed that, in this embodiment, the operation illustrated by the present flow chart is performed through the execution of a program (not shown) stored in the memory 193 by the processor 192.

First, the oscillator 110 and the matching circuit 140 are subjected to initial setting (Step S10). To the oscillator 110, the initial values of the output power and the output frequency are set by the control device 190 through the signals $c1$ and $c2$. For the matching circuit 140, the impedance thereof is initially set. Specifically, the capacitance of the capacitor 142 is adjusted to an initial capacitance value by the control device 190 through the signal $c7$. Here, the initial power value is 0 (zero) watts. The initial capacitance value and the initial frequency are determined as follows prior to Step S10. In a state where a plasma is not generated, the capacitance of the capacitor 142 is controlled so as to minimize the reflected wave power measured with the through power meter 120, while the output frequency of the oscillator 110 is controlled such that the voltage measured with the current-voltage phase difference meter 130 leads the current measured with the current-voltage phase difference meter 130 by a predetermined angle. The capacitance of the capacitor 142 when the reflected wave power is minimized is assumed to be the initial capacitance value. On the other hand, the frequency when the reflected wave power is minimized or a frequency within the limits of a predetermined frequency from the frequency is assumed to be the initial frequency.

Subsequently to the initial setting, preliminary matching (pre-matching) is performed (Step S20). The pre-matching is to effect impedance matching between the oscillator 110 and the coil 160 before the plasma is ignited. In Step S20, the output power of the oscillator 110 is controlled according to a power servo control program for the time of no plasma generation (not shown) stored in the memory 193. Specifically, the control device 190 which executes the power servo control program for the time of no plasma generation (not shown) references the signal $c3$, and controls the output power of the oscillator 110 through the signal $c2$. In this manner, the output power of the oscillator 110 is controlled such that the traveling wave power measured with the through power meter 120 has a power value for pre-matching (which is, e.g., 100 to 200 watts). On the other hand, the output frequency of the oscillator 110 is controlled according to a frequency servo control program for the time of no plasma generation (not shown) stored in the memory 193. Specifically, the control device 190 which executes the frequency servo control program for the time of no plasma generation (not shown) references the signal $c5$, and controls the output frequency of the oscillator 110 through the signal $c1$. In this manner, the output frequency of the oscillator 110 is controlled such that the voltage measured with the current-voltage phase difference meter 130 leads the current measured with the current-voltage phase difference meter 130 by a predetermined angle. The state where the voltage is leading the current indicates that a load impedance at the output terminal of the oscillator 110 is inductive. The inductance of the coil 160 rapidly decreases when a plasma is generated under atmospheric pressure. With the rapid inductance decrease, the load impedance at the output terminal of the oscillator 110 may be capacitive. As the capacitive characteristic of the load impedance increases, the reflected wave power increases to reduce energy supplied to the plasma. As a result, it becomes difficult to maintain the state where the plasma is generated. Therefore, for easier maintenance of the state where the plasma is generated, the output frequency of the oscillator 110 is controlled such that the load impedance prior to plasma generation becomes inductive.

Subsequently to the pre-matching, the plasma is ignited (Step S30). In Step S30, the output power of the oscillator 110 is controlled to a power value for the time of plasma generation (which is, e.g., 1 kilowatt) at a predetermined power increase rate, and electricity is discharged from the antenna 181. The discharge of electricity is implemented by supplying a power to the antenna 181 by the plasma ignition assist device 180 in accordance with the signal $c9$ supplied from the control device 190. The output power of the oscillator 110 is controlled by the control device 190 which executes the power servo control program for the time of no plasma generation (not shown). Further, the output frequency of the oscillator 110 is controlled by the control device 190 which executes the frequency servo control program for the time of no plasma generation (not shown).

Then, it is detected whether or not a plasma is generated (Step S40). Specifically, if the state where the intensity of plasma emission detected by the plasma photodetector 170 exceeds a predetermined value has continued for a predetermined time, it is determined that a plasma is generated. The determination is implemented by the control device 190 which references the signal $c8$.

When the generation of the plasma is confirmed, conditions and methods for controlling the output frequency and power of the oscillator 110 are changed (Step S50). Specifically, the power servo control program executed by the control device 190 is changed to that for the time of plasma generation (not shown). Then, the control device 190 which executes the power servo control program for the time of plasma generation references the signal c3, and controls the output power of the oscillator 110 through the signal c2. In this manner, the output power of the oscillator 110 is controlled such that the traveling wave power measured with the through power meter 120 has a power value for the time of plasma generation. On the other hand, the frequency servo control program executed by the control device 190 is changed to that for the time of plasma generation (not shown). Then, the control device 190 which executes the frequency servo control program for the time of plasma generation (not shown) references the signal c5, and controls the output frequency of the oscillator 110 through the signal c1. In this manner, the output frequency of the oscillator 110 is controlled such that the voltage measured with the current-voltage phase difference meter 130 has the same phase as that of the current measured with the current-voltage phase difference meter 130. In Step S50, the impedance of the matching circuit 140 is also changed. Specifically, the capacitance of the capacitor 142 is controlled by the control device 190 through the signal c7 so as to minimize the reflected wave power measured with the through power meter 120. Alternatively, the capacitance of the capacitor 142 may also be adjusted manually so as to minimize the reflected wave power measured with the through power meter 120. Otherwise, the capacitance of the capacitor 142 may also be changed to a known fixed capacitance value manually or by the control device 190 such that the reflected wave power measured with the through power meter 120 is minimized. Then, when a predetermined time has elapsed after the change of the control conditions and the control methods and after the change of the impedance of the matching circuit 140, the control device 190 controls the plasma ignition assist device 180 through the signal c9 to stop power supply to the antenna 181.

Then, when a sample is analyzed, the output power of the oscillator 110 is controlled by the control device 190 such that the traveling wave power measured with the through power meter 120 has a desired value (Step S60). At this time, the output power of the oscillator 110 is controlled by the control device 190 which executes the power servo control program for the time of plasma generation (not shown). On the other hand, the output frequency of the oscillator 110 is controlled by the control device 190 which executes the frequency servo control program for the time of plasma generation (not shown). The output frequency of the oscillator 110 is controlled such that the voltage measured with the current-voltage phase difference meter 130 has the same phase as that of the current measured with the current-voltage phase difference meter 130.

The power servo control program for the time of no plasma generation, the frequency servo control program for the time of no plasma generation, the power servo control program for the time of plasma generation, and the frequency servo control program for the time of plasma generation may adopt various control methods, and this embodiment adopts PID control. The PID constant of the power servo control program for the time of no plasma generation and the PID constant of the power servo control program for the time of plasma generation may be the same, but it is preferable that proper values be selected individually therefor in accordance with each of the cases including at least the time when no plasma is generated and the time when a plasma is generated. The same holds true with regard to the frequency servo control program for the time of no plasma generation and the frequency servo control program for the time of plasma generation. For example, with regard to the power control, the PID constant is selected such that the power does not undershoot or overshoot for the time of plasma generation, and the PID constant which is relatively tolerant to undershooting or overshooting, but prioritizes a control speed is selected for the time of no plasma generation. With regard to the frequency control, the PID constant which prioritizes control accuracy over the control speed is selected for the time of no plasma generation, and the PID constant which prioritizes the control speed over the control accuracy is selected for the time of plasma generation. By thus selecting the PID constant, the ignition of the plasma and the maintenance of the state where the plasma is generated become easier. In the case where a method other than the PID control is selected also, it is preferable that respective proper parameter values be selected individually for each of the cases including at least the time when no plasma is generated and the time when a plasma is generated.

The embodiment described above can be modified as follows. For example, the respective positions of the through power meter 120 and the current-voltage phase difference meter 130 can be interchanged. It is also possible to replace the capacitor 141 with a variable-capacitance type such as the capacitor 142, and allow the capacitance thereof to be controlled by the control device 190. Further, as means for detecting whether or not a plasma is generated, means for detecting a load impedance change at the output terminal of the oscillator 110 can also be adopted instead of the plasma photodetector 170. A change in load impedance can be monitored as a change in impedance itself, but can also be monitored as a change in a parameter related thereto, e.g., a change in a voltage, current, or phase difference between the voltage and the current in a line between the oscillator 110 and the matching circuit 140, a change in a voltage or current of the traveling wave and the reflected wave in the line, or a change in the voltage ratio or power ratio between the traveling wave and the reflected wave.

Figure 3:
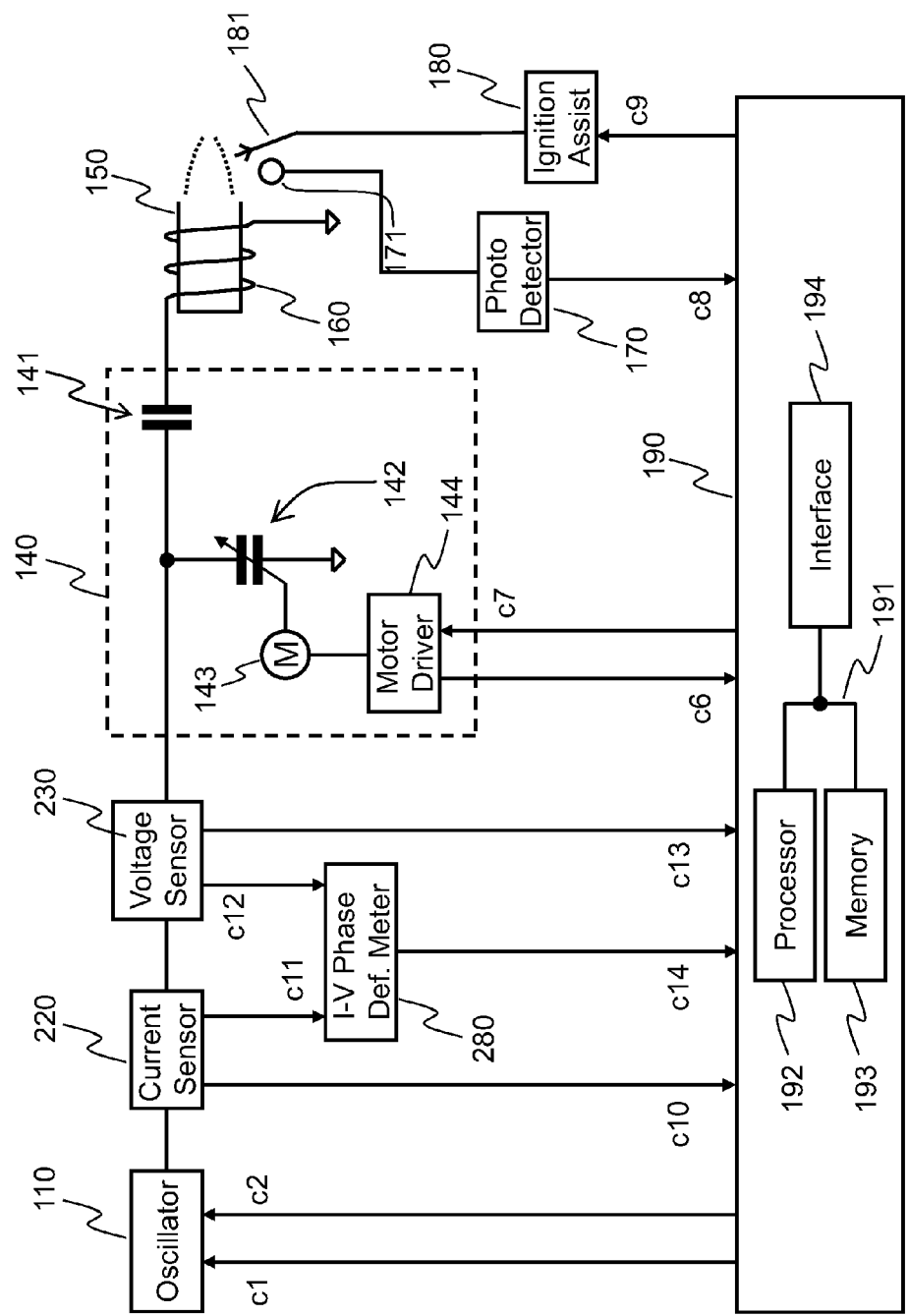
[FIG. 3] A view illustrating a schematic configuration of a plasma generating apparatus 200, which is a variation of the plasma generating apparatus 100.

Further, it is possible to replace the through power meter 120 and the current-voltage phase difference meter 130 with a current sensor 220, a voltage sensor 230, and a current-voltage phase difference meter 280 as illustrated in FIG. 3, which is referred to here. FIG. 3 is a view illustrating a schematic configuration of a plasma generating apparatus 200, which is a variation of the plasma generating apparatus 100. In FIG. 3, the same components as those of FIG. 1 are provided with the same reference numerals. The current sensor 220 is a device which detects a current flowing in the line between the oscillator 110 and the matching circuit 140, and outputs a signal c10 representing amplitude information thereon, and a signal c11 representing phase information thereon. The voltage sensor 230 is a device which detects a voltage in the line between the oscillator 110 and the matching circuit 140, and outputs a signal c12 representing phase information thereon, and a signal c13 representing amplitude information thereon. The current-voltage phase difference meter 280 is a device which references the signals c11 and c12, measures the phase difference between current and voltage in the line between the oscillator 110 and the matching circuit 140, and outputs a signal c14 representing a measured value thereof. The signal c14 is equivalent to the signal c5. Because it is possible to recognize the state of impedance matching from the phase difference, information corresponding to the signals c3 and c4 can be obtained from the signals c10, c13, and c14 by calculation. A person skilled in the art might easily correct the servo control program mentioned above in accordance with these changes.

It is further possible to cause the through power meter 120 to perform the function of the current-voltage phase difference meter 130 in place thereof. By minimizing a parameter (such as power or voltage) of the reflected wave measured with the through power meter 120, or the ratio between the same parameters of the traveling wave and the reflected wave (such as a power-power ratio or voltage-voltage ratio) measured with the through power meter 120, it is possible to adjust the phase difference between current and voltage in the line between the oscillator 110 and the matching circuit 140 to a predetermined angle. By appropriately adjusting the impedance of the matching circuit 140 here, it is possible to select the phase difference between current and voltage in the line between the oscillator 110 and the matching circuit 140 when the above-mentioned parameter of the reflected wave or the above-mentioned parameter ratio is minimized.

The invention claimed is:

1. An atmospheric pressure inductively coupled plasma generating apparatus comprising:
   an oscillator which is controllable in output frequency;
   a coil which is supplied with a power from the oscillator and generates an inductively coupled plasma with the power under atmospheric pressure;
   an impedance matching device disposed between the oscillator and the coil;
   a measuring device for measuring one of: respective phases of a voltage and a current in a line between the oscillator and the impedance matching device; a phase difference between the voltage and the current in the line; a parameter of a reflected wave in the line; and a ratio between the same parameters of a traveling wave and the reflected wave in the line; and
   a control device for controlling the output frequency of the oscillator based on a result of the measurement by the measuring device, the control device controlling the output frequency in accordance with a generation state of the atmospheric inductively coupled plasma.

2. The atmospheric pressure inductively coupled plasma generating apparatus according to claim 1, wherein:
   when the inductively coupled plasma is not generated, the control device controls the output frequency according to a first condition; and
   when the inductively coupled plasma is generated, the control device controls the output frequency according to a second condition different from the first condition.

3. The atmospheric pressure inductively coupled plasma generating apparatus according to claim 2, wherein:
   when the inductively coupled plasma is not generated, the control device controls the output frequency such that the phase of the voltage is caused to lead the phase of the current; and
   when the inductively coupled plasma is generated, the control device controls the output frequency such that the phase difference between the voltage and the current is reduced to zero.

4. The atmospheric pressure inductively coupled plasma generating apparatus according to claim 2, wherein:
   when the inductively coupled plasma is not generated, the control device controls the output frequency according to the first condition by a first control method; and
   when the inductively coupled plasma is generated, the control device controls the output frequency according to the second condition by a second control method different from the first control method.

5. The atmospheric pressure inductively coupled plasma generating apparatus according to claim 4, wherein:
   each of the first control method and the second control method comprises PID control; and
   the second control method has a PID constant different from that of the first control method.

6. The atmospheric pressure inductively coupled plasma generating apparatus according to claim 1, wherein:
   the oscillator is controllable in output power; and
   the control device controls the output power of the oscillator in accordance with a generation state of the inductively coupled plasma.

7. The atmospheric pressure inductively coupled plasma generating apparatus according to claim 6, wherein:
   when the inductively coupled plasma is not generated, the control device controls the output power of the oscillator according to a third condition; and
   when the inductively coupled plasma is generated, the control device controls the output power according to a fourth condition different from the third condition.

8. The atmospheric pressure inductively coupled plasma generating apparatus according to claim 6, wherein:
   when the inductively coupled plasma is not generated, the control device controls the output power according to the third condition by a third control method; and
   when the inductively coupled plasma is generated, the control device controls the output power according to the fourth condition by a fourth control method different from the third control method.

9. The atmospheric pressure inductively coupled plasma generating apparatus according to claim 8, wherein:
   each of the third control method and the fourth control method comprises PID control; and
   the fourth control method has a PID constant different from that of the third control method.

10. The atmospheric pressure inductively coupled plasma generating apparatus according to claim 1, wherein the oscillator is of a separately excited type.

11. An atmospheric pressure inductively coupled plasma generating apparatus comprising:
    an oscillator which is controllable in output frequency;
    a coil which is supplied with a power from the oscillator and generates an inductively coupled plasma with the power under atmospheric pressure;
    an impedance matching device disposed between the oscillator and the coil;
    a measuring device for measuring one of: respective phases of a voltage and a current in a line between the oscillator and the impedance matching device; a phase difference between the voltage and the current in the line; a parameter of a reflected wave in the line; and a ratio between the same parameters of a traveling wave and the reflected wave in the line; and
    a control device for controlling the output frequency of the oscillator based on a result of the measurement by the measuring device, the control device controlling the output frequency in accordance with a generation state of the atmospheric inductively coupled plasma;
    wherein: when the inductively coupled plasma is not generated, the control device controls the output frequency according to a first condition; and when the inductively coupled plasma is generated, the control device controls the output frequency according to a second condition different from the first condition.

12. The apparatus of claim 11, wherein:
    when the inductively coupled plasma is not generated, the control device controls the output frequency such that the phase of the voltage is caused to lead the phase of the current; and
    when the inductively coupled plasma is generated, the control device controls the output frequency such that the phase difference between the voltage and the current is reduced to zero.

13. The apparatus of claim 11, wherein:
when the inductively coupled plasma is not generated, the control device controls the output frequency according to the first condition by a first control method; and
when the inductively coupled plasma is generated, the control device controls the output frequency according to the second condition by a second control method different from the first control method.

14. The apparatus of claim 13, wherein:
each of the first control method and the second control method comprises PID control; and
the second control method has a PID constant different from that of the first control method.

15. The apparatus of claim 11, wherein:
the oscillator is controllable in output power; and
the control device controls the output power of the oscillator in accordance with a generation state of the inductively coupled plasma.

16. The apparatus of claim 15, wherein:
when the inductively coupled plasma is not generated, the control device controls the output power of the oscillator according to a third condition; and
when the inductively coupled plasma is generated, the control device controls the output power according to a fourth condition different from the third condition.

17. The apparatus of claim 15, wherein:
when the inductively coupled plasma is not generated, the control device controls the output power according to the third condition by a third control method; and
when the inductively coupled plasma is generated, the control device controls the output power according to the fourth condition by a fourth control method different from the third control method.

18. The apparatus of claim 17, wherein:
each of the third control method and the fourth control method comprises PID control; and
the fourth control method has a PID constant different from that of the third control method.

19. The apparatus of claim 11, wherein the oscillator is of a separately excited type.

* * * * *